United States Patent
Hui et al.

(10) Patent No.: US 6,475,867 B1
(45) Date of Patent: Nov. 5, 2002

(54) METHOD OF FORMING INTEGRATED CIRCUIT FEATURES BY OXIDATION OF TITANIUM HARD MASK

(75) Inventors: Angela T. Hui, Fremont, CA (US); Kouros Ghandehari, Santa Clara, CA (US); Bhanwar Singh, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/824,416

(22) Filed: Apr. 2, 2001

(51) Int. Cl.$^7$ .............................................. H07L 21/336
(52) U.S. Cl. ...................... 438/299; 438/694
(58) Field of Search ................. 438/299, 300, 438/689, 694; 430/314

(56) References Cited

U.S. PATENT DOCUMENTS 6,165,695 A * 12/2000 Yang et al. ................. 430/314
6,211,078 B1 * 4/2001 Mathews ..................... 438/669
6,323,093 B1 * 11/2001 Xiang et al. ................. 438/299

* cited by examiner

Primary Examiner—Michael Sherry
Assistant Examiner—Lisa Kilday
(74) Attorney, Agent, or Firm—Foley & Lardner

(57) ABSTRACT

An exemplary method of forming integrated circuit device features by oxidization of titanium hard mask is described. This method can include providing a photoresist pattern of photoresist features over a first layer of material deposited over a second layer of material; etching the first layer of material according to the photoresist pattern to form material features; oxidizing exposed portions of the material features where the material features are made of a material which expands during oxidation; and etching the second layer of material according to the material features which have expanded as a result of oxidation. Advantageously, the expansion of the material features results in a smaller distance between material features than the distance between photoresist features.

20 Claims, 2 Drawing Sheets

METHOD OF FORMING INTEGRATED CIRCUIT FEATURES BY OXIDATION OF TITANIUM HARD MASK

CROSS REFERENCE TO RELATED APPLICATIONS

This application is related to U.S. application Ser. No. 09/597,624, now U.S. Pat. No. 6,391,753, and U.S. application Ser. No. 09/597,598, now U.S. Pat. No. 6,391,782, both filed on Jun. 20, 2000. This application is also related to U.S. application Ser. No. 09/824,415 and U.S. application Ser. No. 09/824,420, both filed on Apr. 02, 2001.

FIELD OF THE INVENTION

The present invention relates generally to the field of integrated circuits and to methods of manufacturing integrated circuits. More particularly, the present invention relates to a method of forming integrated circuit features via a titanium hard mask.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to put millions of devices on an IC, there is still a need to decrease the size of IC device features, and, thus, increase the number of devices on an IC.

One limitation to the smallness of IC critical dimensions is conventional lithography. In general, projection lithography refers to processes for pattern transfer between various media. According to conventional projection lithography, a silicon slice, the wafer, is coated uniformly with a radiation-sensitive film or coating, the photoresist. An exposing source of radiation (such as light, x-rays, or an electron beam) illuminates selected areas of the surface through an intervening master template, the mask, for a particular pattern. The lithographic coating is generally a radiation-sensitized coating suitable for receiving a projected image of the subject pattern. Once the image is projected, it is indelibly formed in the coating. The projected image may be either a negative or a positive image of the subject pattern.

Exposure of the coating through a photomask or reticle causes the image area to become selectively crosslinked and consequently either more or less soluble (depending on the coating) in a particular solvent developer. The more soluble (i.e., uncrosslinked) or deprotected areas are removed in the developing process to leave the pattern image in the coating as less soluble polymer.

Projection lithography is a powerful and essential tool for microelectronics processing. As feature sizes are driven smaller and smaller, optical systems are approaching their limits caused by the wavelengths of the optical radiation.

One alternative to projection lithography is EUV lithography. EUV lithography reduces feature size of circuit elements by lithographically imaging them with radiation of a shorter wavelength. "Long" or "soft" x-rays (a.k.a, extreme ultraviolet (EUV)), wavelength range of lambda=50 to 700 angstroms are used in an effort to achieve smaller desired feature sizes (134 in particular).

In EUV lithography, EUV radiation can be projected onto a resonant-reflective reticle. The resonant-reflective reticle reflects a substantial portion of the EUV radiation which carries an IC pattern formed on the reticle to an all resonant-reflective imaging system (e.g., series of high precision mirrors). A demagnified image of the reticle pattern is projected onto a resist coated wafer. The entire reticle pattern is exposed onto the wafer by synchronously scanning the mask and the wafer (i.e., a step-and-scan exposure).

Although EUV lithography provides substantial advantages with respect to achieving high resolution patterning, errors may still result from the EUV lithography process. For instance, the reflective reticle employed in the EUV lithographic process is not completely reflective and consequently will absorb some of the EUV radiation. The absorbed EUV radiation results in heating of the reticle. As the reticle increases in temperature, mechanical distortion of the reticle may result due to thermal expansion of the reticle.

Both conventional projection and EUV lithographic processes are limited in their ability to print small features, such as, contacts, trenches, polysilicon lines or gate structures. As such, the critical dimensions of IC device features, and, thus, IC devices, are limited in how small they can be.

Thus, there is a need to pattern IC devices using non-conventional lithographic techniques. Further, there is a need to form smaller feature sizes, such as, smaller contact holes and trench lines. Yet further, there is a need to form integrated circuit features by oxidation of titanium hard mask.

SUMMARY OF THE INVENTION

An exemplary embodiment is related to a method of forming integrated circuit device features by oxidization of a titanium hard mask. This method can include providing a photoresist pattern of photoresist features over a first layer of material deposited over a second layer of material; etching the first layer of material according to the photoresist pattern to form material features; oxidizing exposed portions of the material features where the material features are made of a material which expands during oxidation; and etching the second layer of material according to the material features which have expanded as a result of oxidation. Advantageously, the expansion of the material features results in a smaller distance between material features than the distance between photoresist features.

Briefly, another exemplary embodiment is related to a method of manufacturing an integrated circuit. This method can include depositing a photoresist material over a layer of titanium deposited over an inter-level dielectric (ILD) layer; etching the photoresist material to form photoresist features having a first separation distance from each other; etching the layer of titanium using the photoresist features as a mask to form titanium features; and oxidizing the titanium features such that the titanium features expand and are separated from each other by a second separation distance. Advantageously, the second separation distance is less than the first separation distance.

Briefly, another embodiment is related to an integrated circuit having trench lines. This integrated circuit is manufactured by a method which can include providing a photoresist pattern of photoresist features over a first layer of material deposited over a second layer of material; etching the first layer of material according to the photoresist pattern to form material features; oxidizing exposed portions of the material features where the material features are made of a material which expands during oxidation; and etching the second layer of material according to the material features which have expanded as a result of oxidation. Advantageously, the expansion of the material features results in a smaller distance between material features than the distance between photoresist features.

Other principle features and advantages of the present invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF EXEMPLARY EMBODIMENTS

Figure 1:
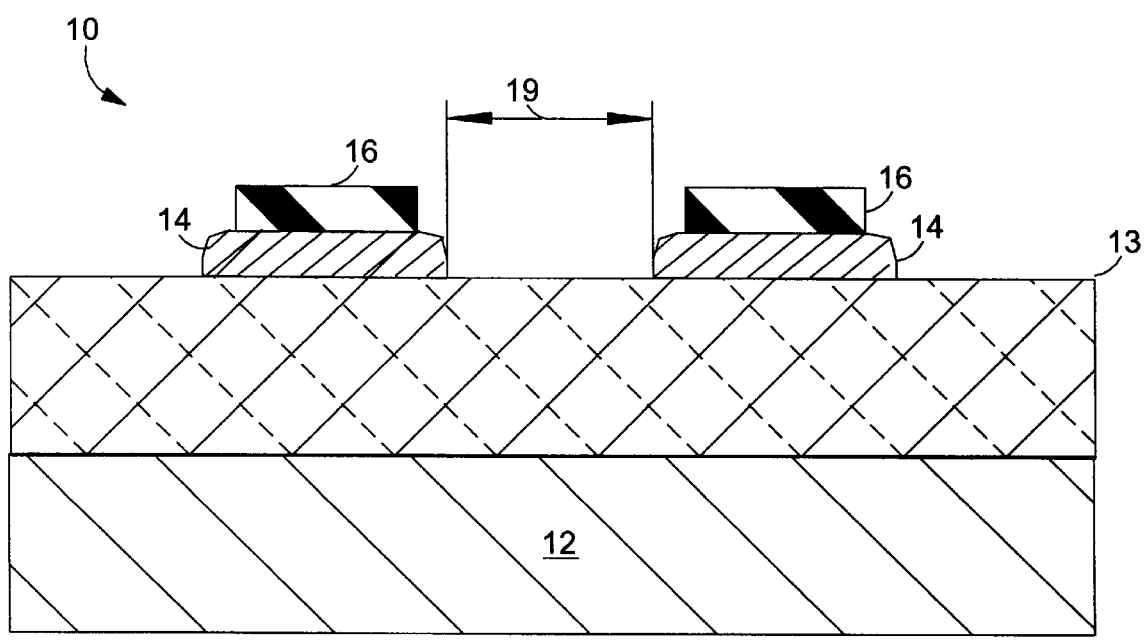
FIG. 1 is a cross-sectional view of a portion of an integrated circuit fabricated in accordance with an exemplary embodiment.

Referring to FIG. 1, a cross-sectional view of a portion 10 of an integrated circuit (IC) includes a substrate 12, an inter-level dielectric (ILD) layer 13, titanium features 14, and photoresist features 16. Portion 10 is preferably part of an ultra-large-scale integrated (ULSI) circuit having millions or more transistors. Portion 10 is manufactured as part of the IC on a semiconductor wafer, such as, a silicon wafer.

Substrate 12 is preferably single crystal silicon material. ILD layer 13 can include oxide or any other suitable material having a low dielectric constant k. In an exemplary embodiment, ILD layer 13 is tetraethyl orthosilicate (TEOS) deposited silicon dioxide. Titanium features 14 are made at least partially of a titanium material. In alternative embodiments, titanium features 14 are made at least partially of some other material which expands or swells during oxidation. In an exemplary embodiment, titanium features 14 have been patterned, etched, and oxidized and can serve as a hard mask for etching of ILD layer 13. In an exemplary embodiment, titanium features 14 are separated by a distance 19. Distance 19 can be 1600 Angstroms. In alternative embodiments, distance 19 can be less than 2300 Angstroms or between 1400 and 2300 Angstroms.

Photoresist features 16 can be photoresist or an anti-reflective coating (ARC), such as, silicon nitride ($Si_3N_4$), silicon oxynitride (SiON), or any other suitable material having appropriate anti-reflective properties. Photoresist features 16 are located on top of titanium features 14. In an exemplary embodiment, photoresist features 16 have a width (left-to-right) of between 1600 and 2500 Angstroms, compared to oxidized and expanded titanium features 14 which can have a width of between 1800 and 2700 Angstroms. The width between photoresist features 16 is preferably one minimum lithographic feature.

Titanium features 14 have a greater width (illustrated in FIG. 1 as left-to-right) than photoresist features 16 due to the expansion of titanium features 14 during oxidation. Advantageously, the greater width of titanium features 14 decreases the space or width to be etched in the creation of a contact hole or trench line in ILD layer 13. As such, the contact hole or trench line has a narrower width than the critical dimension possible using conventional lithographic techniques. In an exemplary embodiment, the distance between titanium features 14 is 1600 Angstroms. In an alternative embodiments, the distance can be less than 1400 Angstroms.

Figure 2:
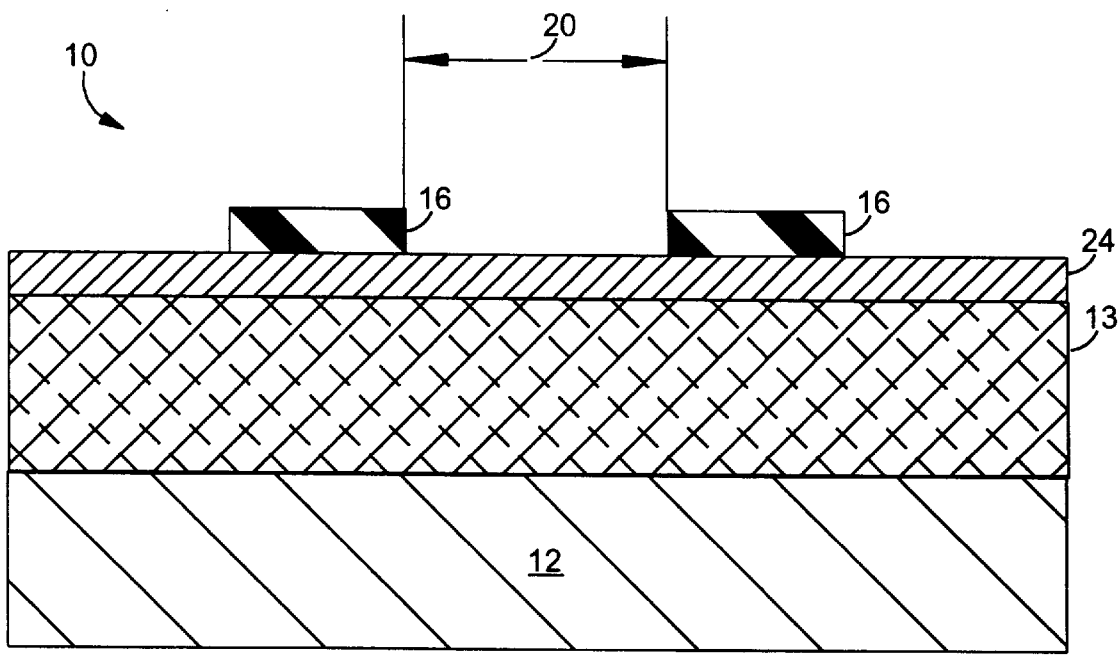
FIG. 2 is a cross-sectional view of a portion of an integrated circuit, showing a patterning and etching step used in an exemplary method of manufacturing the integrated circuit illustrated in FIG. 1.

The method of forming portion 10 is described below with reference to FIGS. 1–3. The method advantageously forms portion 10 having integrated circuit device features with small critical dimensions. In FIG. 2, a cross-sectional view of portion 10 illustrates photoresist features 16, a titanium layer 24, ILD layer 13, and substrate 12. Photoresist features 16 have been patterned with a standard feature critical dimension 20. In an exemplary embodiment, standard feature critical dimension 20 is 1600 Angstroms. Alternatively, standard feature critical dimension can be 1400 Angstroms. In an exemplary embodiment, photoresist features 16 are created in a lithographic process involving deposition of photoresist material and selective etching of the photoresist material. Standard feature critical dimension 20 is preferably one minimum lithographic feature.

Photoresist features 16 are used to transfer the pattern of standard feature critical dimension 20 to titanium layer 24. Titanium layer 24 is etched with this pattern and photoresist features 16 are stripped. Any of a variety of etching processes may be utilized, such as, plasma etching. In one embodiment, titanium layer 24 is 500–1000 Angstroms thick. In alternative embodiments, additional layers may also be present in portion 10.

Figure 3:
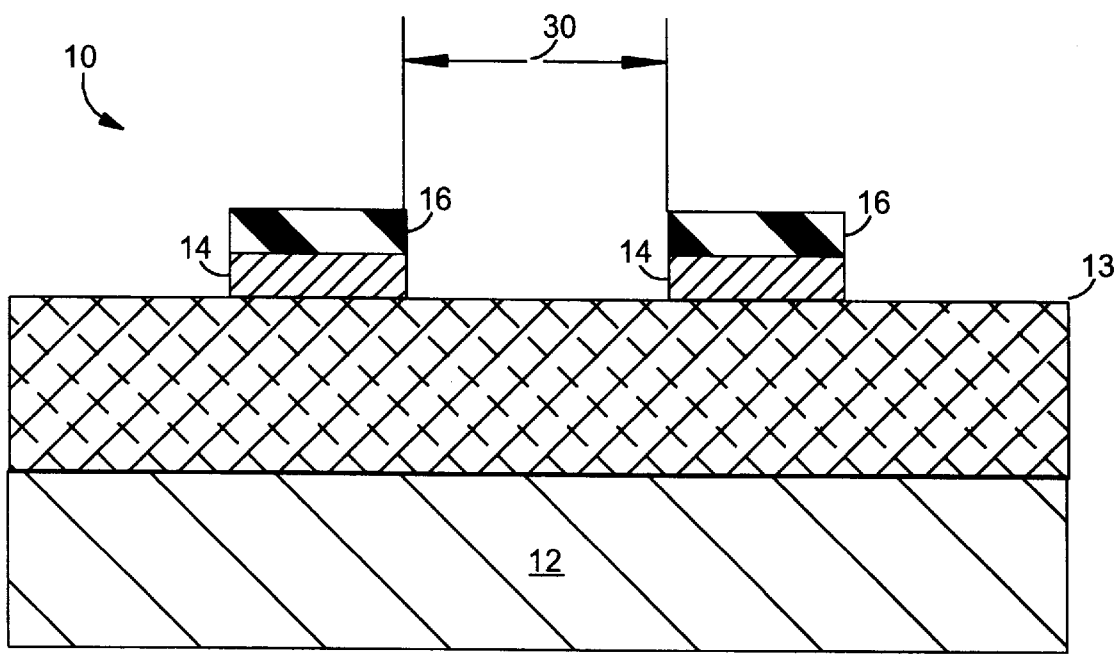
FIG. 3 is a cross-sectional view of a portion of an integrated circuit, showing an oxidization step in an exemplary method of manufacturing the integrated circuit illustrated in FIG. 1.

In FIG. 3, a cross-sectional view of portion 10 illustrates that titanium layer 24 (FIG. 2) has been etched to form titanium features 14. In an exemplary embodiment, a plasma etch is used to transfer the pattern of photoresist features 16 to titanium layer 24. After etching, exposed side wall portions of titanium features 14 are oxidized. Oxidization of titanium features 14 can occur at an unaltered atmospheric environment. In alternative embodiments, the atmospheric environment is altered to adjust the level of oxidation and the oxidation effect on titanium features 14. The greater the oxidation level, the greater the expansion effect on titanium features 14. Alternatively, oxidation of titanium features 14 can be done by RTA (rapid thermal anneal) in an oxygen ambient environment. In an exemplary embodiment, oxidation occurs at room temperature and over a time period of more than an hour.

In an exemplary embodiment, titanium features 14 expand laterally by approximately 100 Angstroms (Å) per side. After oxidation and expansion, titanium features 14 can have a width (left-to-right) of 1800–2700 Angstroms. The increased width of titanium features 14 results in a decreased distance between each other, as described with reference to FIG. 1.

Advantageously, the use of titanium features 14 results in smaller critical dimensions for contact holes and trench lines in ILD layer 13. Further, the method described with reference to FIGS. 1–3 avoids the feature size limitations inherent to conventional lithography.

While the embodiments illustrated in the FIGURES and described above are presently preferred, it should be understood that these embodiments are offered by way of example only. Other embodiments may include, for example, different methods of patterning or etching various layers as well as different materials which expand during oxidation like titanium. The invention is not limited to a particular embodiment, but extends to various modifications, combinations, and permutations that nevertheless fall within the scope and spirit of the appended claims.

What is claimed is:

1. A method of forming integrated circuit device features by oxidization of titanium hard mask, the method comprising:

providing a photoresist pattern of photoresist features over a first layer of material deposited over a second layer of material;

etching the first layer of material according to the photoresist pattern to form material features;

oxidizing exposed portions of the material features, the material features being made of a material which expands during oxidation; and etching the second layer of material according to the material features which have expanded as a result of oxidation, the expansion resulting in a smaller distance between material features than the distance between photoresist features.

2. The method of claim 1, wherein the material of the first layer of material is titanium.

3. The method of claim 1, wherein the step of oxidizing exposed portions of material features comprises providing, an unaltered atmospheric environment.

4. The method of claim 1, wherein the etching the first layer of material comprises providing a plasma etch.

5. The method of claim 1, wherein the material of the first layer of material is any material that expands due to oxidation.

6. The method of claim 1, wherein the photoresist pattern includes a distance between photoresist features which is 1600–2500 Angstroms.

7. The method of claim 1, wherein the expansion of the material features results in a distance between material features of 1400–2300 Angstroms.

8. A method of manufacturing an integrated circuit comprising:

depositing a photoresist material over a layer of titanium deposited over an inter-level dielectric (ILD) layer;

etching the photoresist material to form photoresist features having a first separation distance from each other;

etching the layer of titanium using the photoresist features as a mask to form titanium features; and oxidizing the titanium features such that the titanium features expand and are separated from each other by a second separation distance, the second separation distance being less than the first separation distance.

9. The method of claim 8, wherein the first separation distance is 1600–2500 Angstroms.

10. The method of claim 8, wherein the second separation distance is 1400–2300 Angstroms.

11. The method of claim 8, further comprising using the expanded titanium features as a hard mask to etch a contact hole in the ILD layer.

12. The method of claim 8, further comprising using the expanded titanium features as a hard mask to etch a trench line in the ILD layer.

13. The method of claim 8, wherein the expanded titanium features have a width of approximately 100 Angstroms per side.

14. A method of forming integrated circuit device features, the method comprising:

patterning an oxidizable layer using a resist layer to form at least two oxidizable features;

oxidizing the at least two oxidizable features, the at least two oxidizable features including a material that expands during oxidation, wherein a distance between the at least two oxidizable features decreases due to expansion of the at least two oxidizable features during oxidation; and patterning a layer under the at least two oxidizable features to form a feature, the feature having a critical dimension substantially equivalent to the distance between,the at least two oxidizable features.

15. The method of claim 14, wherein oxidizing the at least two oxidizable features comprises oxidizing at ambient temperature.

16. The method of claim 14, wherein the feature is a contact hole.

17. The method of claim 14, wherein oxidizing the at least two oxidizable features comprises performing a rapid thermal anneal (RTA).

18. The method of claim 14, wherein the distance is 1400–2300 Angstroms.

19. The method of claim 14, wherein the material is titanium.

20. The method of claim 14, wherein patterning an oxidizing layer comprises providing a plasma etch.

* * * * *